(12) United States Patent
Yamasaki (10) Patent No.: US 10,242,708 B2
(45) Date of Patent: Mar. 26, 2019

(54) DISK APPARATUS AND HEAD APPARATUS (71) Applicants: KABUSHIKI KAISHA TOSHIBA, Tokyo (JP); TOSHIBA ELECTRONIC DEVICES & STORAGE CORPORATION, Tokyo (JP)

(72) Inventor: Nobuyoshi Yamasaki, Kamakura Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 15/908,820

(22) Filed: Mar. 1, 2018

(65) Prior Publication Data
US 2019/0066729 A1 Feb. 28, 2019

(30) Foreign Application Priority Data
Aug. 30, 2017 (JP) ................. 2017-165436

(51) Int. Cl.
*G11B 5/09* (2006.01)
*G11B 20/18* (2006.01)
*H05K 1/11* (2006.01)
*H05K 1/02* (2006.01)

(52) U.S. Cl.
CPC ............. *G11B 20/18* (2013.01); *G11B 5/09* (2013.01); *H05K 1/028* (2013.01); *H05K 1/111* (2013.01); *H05K 2201/09445* (2013.01); *H05K 2201/10151* (2013.01); *H05K 2201/10159* (2013.01)

(58) Field of Classification Search
None
See application file for complete search history.

(56) References Cited

U.S. PATENT DOCUMENTS

| | | | | |
|---|---|---|---|---|
| 5,392,172 | A | * | 2/1995 | Yoshinaga ............. G11B 5/012 360/46 |
| 5,589,777 | A | | 12/1996 | Davis et al. |
| 6,104,199 | A | * | 8/2000 | Sako ..................... G01R 31/025 324/210 |
| 6,141,162 | A | * | 10/2000 | Kotani ................. G11B 5/012 360/46 |

(Continued)

*Primary Examiner* — Peter Vincent Agustin
(74) *Attorney, Agent, or Firm* — Kim & Stewart LLP (57) ABSTRACT

A disk apparatus includes a disk, a head, a circuit board, and an abnormality detection circuit. The head includes a plurality of loads, including at least a first load and a second load, associated with writing or reading of data to or from the disk, and a plurality of head terminals corresponding to and connected to the plurality of loads, respectively. The circuit board includes board terminals corresponding to and connected to the plurality of head terminals, respectively, and a preamplifier that applies a voltage to the loads via the plurality of board terminals during writing or reading of the data to or from the disk. The abnormality detection circuit detects a short-circuit between a first board terminal, which is the board terminal connected to the head terminal of the first load, and a second board terminal, which is the board terminal connected to the head terminal of the second load.

15 Claims, 5 Drawing Sheets

(56) References Cited

U.S. PATENT DOCUMENTS

| | | | |
|---|---|---|---|
| 2001/0010602 A1* | 8/2001 | Takahashi | G11B 5/455 360/25 |
| 2003/0142449 A1* | 7/2003 | Iwata | H02H 1/0015 361/58 |
| 2006/0139822 A1 | 6/2006 | Kurita et al. | |
| 2008/0186634 A1* | 8/2008 | Axtman | G11B 5/40 360/313 |
| 2010/0225331 A1 | 9/2010 | Fuchigami et al. | |
| 2017/0162222 A1* | 6/2017 | Matousek | G11B 7/126 |

* cited by examiner

DISK APPARATUS AND HEAD APPARATUS

CROSS-REFERENCE TO RELATED APPLICATION

This application is based upon and claims the benefit of priority from Japanese Patent Application No. 2017-165436, filed Aug. 30, 2017, the entire contents of which are incorporated herein by reference.

FIELD

Embodiments described herein relate generally to a disk apparatus and a head apparatus.

BACKGROUND

A technique for detecting an abnormality of a load on a head provided on a disk apparatus has been developed. The abnormality is, for example, a short-circuit of a read terminal connected to the head or a short-circuit of a write terminal connected to the head.

Meanwhile, an increase in the number of terminals mounted on the head causes a reduction in the distance between a plurality of terminals of a flexible printed circuit (FPC) connected to the terminals mounted on the head apparatus. This possibly may result in contact failures which occur in the circuit elements provided in the head apparatus and also between the plurality of terminals provided on the FPC.

DETAILED DESCRIPTION

Embodiments provide a disk apparatus and a head apparatus capable of preventing failures that occur in the disk apparatus.

In general, according to one embodiment, a disk apparatus includes a disk, a head, a circuit board, and an abnormality detection circuit. The head includes a plurality of loads, including at least a first load and a second load, associated with writing or reading of data to or from the disk, and a plurality of head terminals corresponding to and connected to the plurality of loads, respectively. The circuit board includes a plurality of board terminals corresponding to and connected to the plurality of head terminals, respectively, and a preamplifier that applies a voltage to the loads via the plurality of board terminals during writing or reading of the data to or from the disk. The abnormality detection circuit detects a short-circuit between a first board terminal which is the board terminal connected to the head terminal of the first load, and a second board terminal, which is the board terminal connected to the head terminal of the second load.

A disk apparatus and a head apparatus according to an embodiment will be described in detail with reference to the accompanying drawings. It is noted that this embodiment does not limit the scope of the present disclosure.

Figure 1:
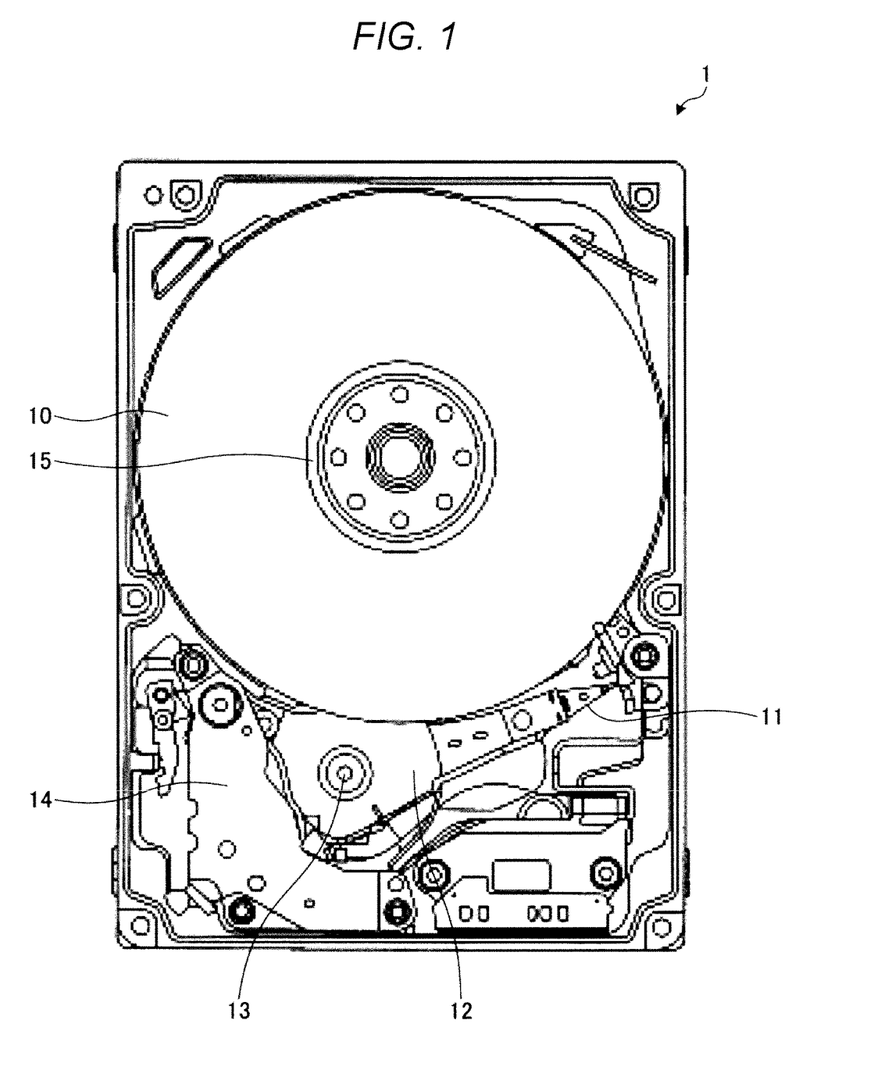
FIG. 1 shows an example of a configuration of a disk apparatus according to an embodiment of the present disclosure.

FIG. 1 shows an example of a configuration of a disk apparatus according to the present embodiment. A disk apparatus 1 has a circular disk 10 and a magnetic head 11 that writes data to the disk 10 or reads data from the disk 10. The magnetic head 11 has a plurality of loads, for example, write heads writing data to the disk 10 and read heads reading data from the disk 10, associated with writing or reading of data to or from the disk 10. The magnetic head 11 also has a plurality of terminals (hereinafter, referred to as "head terminals") corresponding to and connected to the plurality of loads provided on the magnetic head 11, respectively.

In addition, the disk apparatus 1 has a carriage 12, a pivot 13, a voice coil motor (VCM) 14, and a spindle motor 15. The carriage 12 is of a plate-like shape and rotates about the pivot 13 that serves as an axis. The carriage 12 supports the magnetic head 11 in an end portion opposite to the pivot 13, and moves the magnetic head 11 on the disk 10 by rotating about the pivot 13 that serves as the axis.

The VCM 14 moves the carriage 12 to any track on the disk 10. The spindle motor 15 rotates the disk 10. The disk apparatus 1 reads or writes data from or to the disk 10 at various positions on the disk 10 by changing positions of the magnetic head 11 and the disk 10 relatively to each other.

Figure 2:
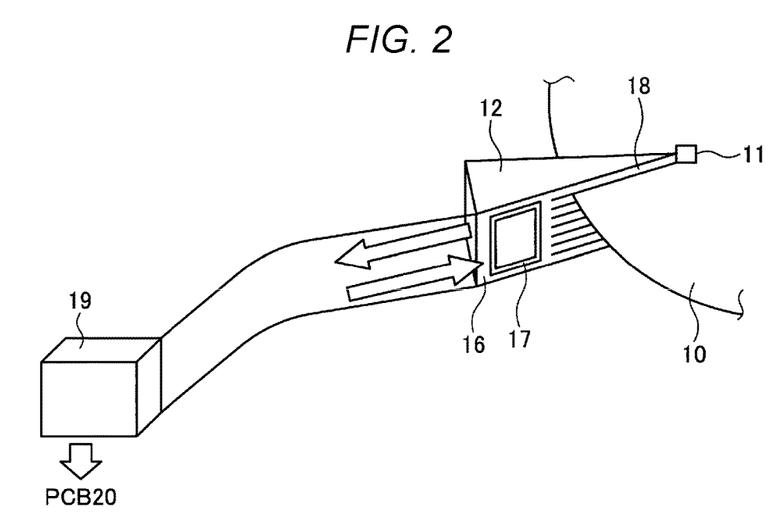
FIG. 2 shows an example of a carriage of the disk apparatus according to the present embodiment.

FIG. 2 shows an example of the carriage of the disk apparatus according to the present embodiment. An example of the carriage 12 of the disk apparatus 1 according to the present embodiment will next be described with reference to FIG. 2. A flexible printed circuit (FPC) 16 is attached to a side surface of the carriage 12. The FPC 16 has a preamplifier 17. The preamplifier 17 applies a voltage to each of the loads such as the write heads and the read heads provided on the magnetic head 11 via a trace line 18 that is an interconnection connecting the FPC 16 to the magnetic head 11. The preamplifier 17 thereby controls the magnetic head 11 to write data to the disk 10 or read data from the disk 10. Furthermore, the preamplifier 17 is connected to a printed circuit board (PCB) 20, to be described later, via a connector 19. The PCB 20 is a controller that controls the disk apparatus 1. In the present embodiment, the FPC 16 and the magnetic head 11 are an example of the head apparatus.

Figure 3:
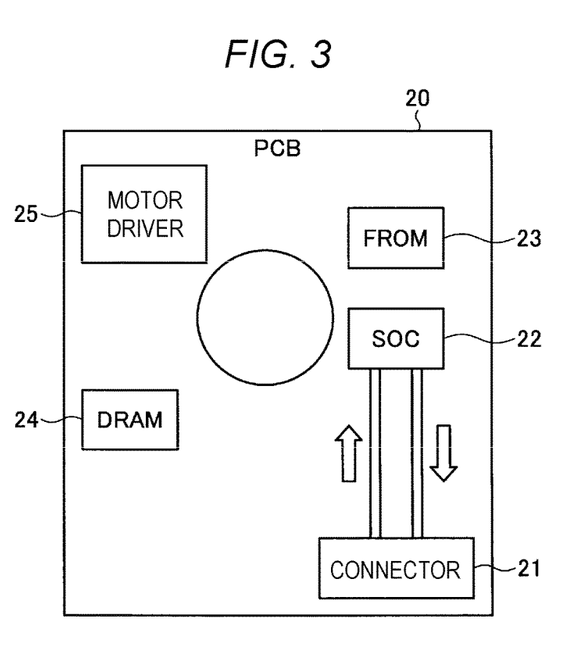
FIG. 3 shows an example of a PCB provided in the disk apparatus according to the present embodiment.

FIG. 3 shows an example of the PCB provided in the disk apparatus according to the present embodiment. An example of the PCB 20 provided in the disk apparatus 1 according to the present embodiment will next be described with reference to FIG. 3. The PCB 20 has a connector 21, a system-on-chip (SOC) 22, a flash read-only memory (FROM) 23, a dynamic random access memory (DRAM) 24, and a motor drive 25. The SOC 22, which is connected to the FPC 16 via the connector 21, controls timing at which the preamplifier 17 writes data to the disk 10 and timing at which the preamplifier 17 reads data from the disk 10. Furthermore, the preamplifier 17 inputs the data read from the disk 10 to the SOC 22 via the connector 21, and the SOC 22 outputs the input data to an external apparatus. Moreover, the SOC 22 outputs the data to be written to the disk 10 to the preamplifier 17 via the connector 21. Further, the SOC 22 has a power loss protection (PLP) function that saves the data that is being written to the disk 10 and that is to be stored in the DRAM 24, to be described later, in the FROM 23, to be described later, when it is detected that supply of electric power to the disk apparatus 1 from the external apparatus is cut off.

The FROM 23 is a storage unit in which the data which is to be written to the disk 10, is stored by the PLP function. The DRAM 24 is a cache memory that stores the data which is being written to the disk 10. The motor driver 25 is a driver that controls the various motors such as the VCM 14 and the spindle motor 15 provided in the disk apparatus 1 to be driven.

Figure 4:
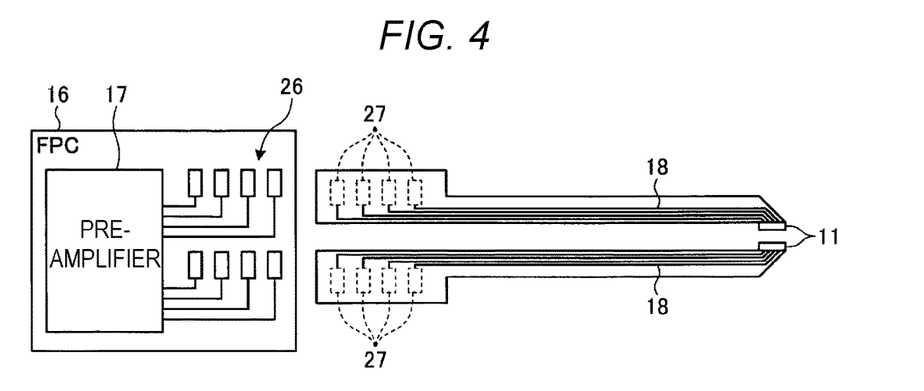
FIG. 4 shows an example of an FPC and a magnetic head provided in the disk apparatus according to the present embodiment.

FIG. 4 shows an example of the FPC and the magnetic head provided in the disk apparatus according to the present embodiment. Various terminals provided on the FPC 16 and the magnetic head 11 that are provided in the disk apparatus 1 according to the present embodiment will next be described with reference to FIG. 4. The FPC 16 has a group of board terminals (hereinafter, referred to as "board terminal group") 26 corresponding to and connected to the plurality of head terminals provided on the magnetic head 11, respectively, in addition to the preamplifier 17. The board terminal group 26 is connected to the preamplifier 17 via interconnections disposed on the FPC 16. As described above, the magnetic head 11 has the loads such as the write heads and the read heads, and head terminals 27 connected to the loads via the trace lines 18. In the present embodiment, the board terminals provided in the board terminal group 26 are connected to the head terminals 27 by soldering.

Figure 5:
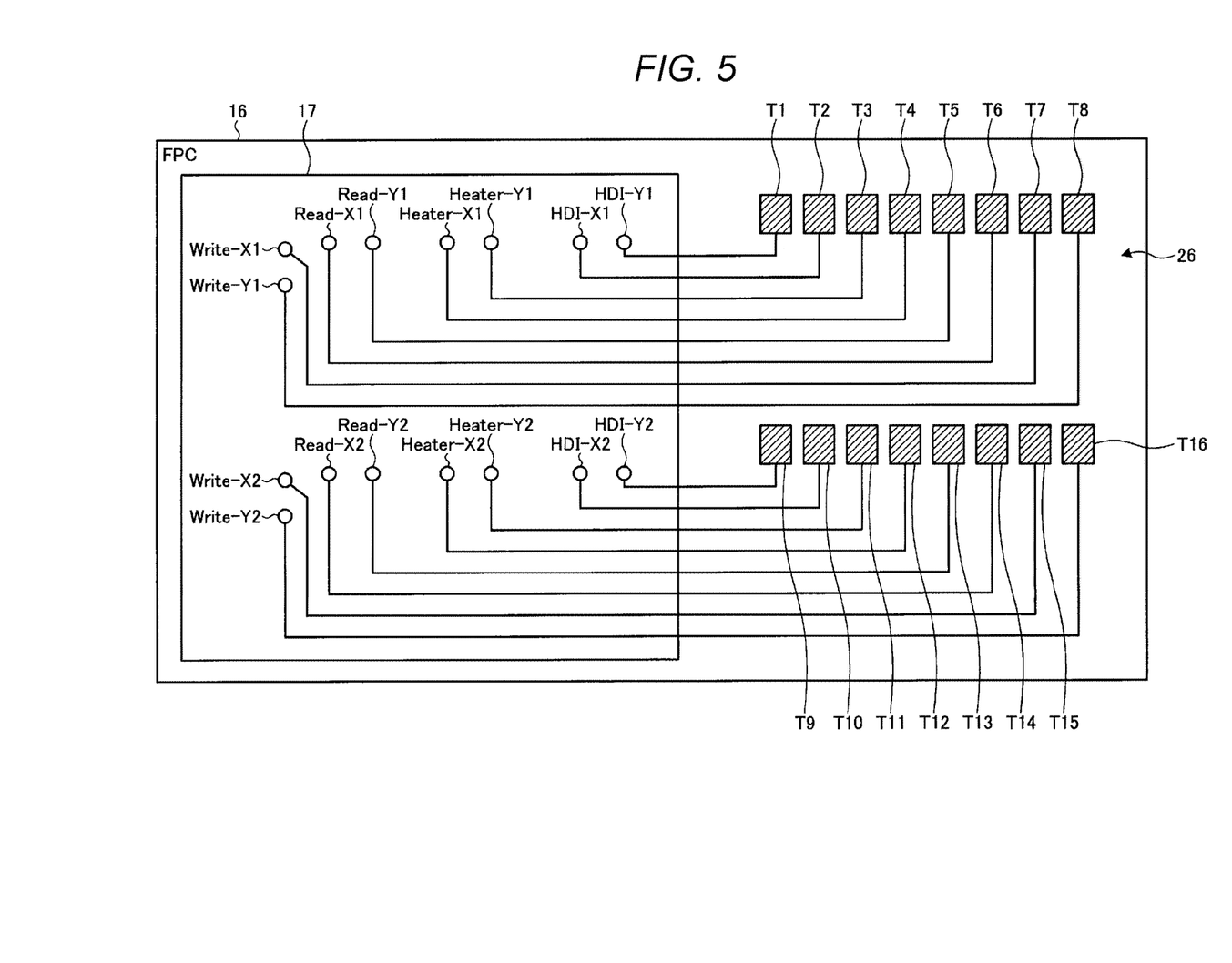
FIG. 5 shows an example of a specific configuration of the FPC provided in the disk apparatus according to the present embodiment.

FIG. 5 shows an example of a specific configuration of the FPC provided in the disk apparatus according to the present embodiment. A specific configuration of the FPC 16 provided in the disk apparatus 1 according to the present embodiment will next be described with reference to FIG. 5. The FPC 16 has the board terminal group 26 that includes a plurality of board terminals T1 to T16 (hereinafter, described as "board terminals T" when being not distinguished), and the preamplifier 17 connected to the board terminals T1 to T16 via the interconnections disposed on the FPC 16. The board terminals T1 and T2 are connected to the head terminals 27 of a contact sensor that is an example of the loads provided on the magnetic head 11. The contact sensor is a sensor that detects a contact between the magnetic head 11 and the disk 10.

The board terminals T3 and T4 are connected to the head terminals 27 of a heater that is an example of the loads provided on the magnetic head 11. The heater heats the magnetic head 11 and controls thermal expansion of the magnetic head 11. The board terminals T5 and T6 are connected to the head terminals 27 of one read head that is an example of the loads provided on the magnetic head 11. The board terminals T7 and T8 are connected to the head terminals 27 of one write head that is an example of the loads provided on the magnetic head 11. The board terminals T9 and T10 are connected to the head terminals 27 of a contact sensor that is an example of the loads provided on the magnetic head 11 and that differs from the contact sensor to which the board terminals T1 and T2 are connected. The board terminals T11 and T12 are connected to the head terminals 27 of a heater that is an example of the loads provided on the magnetic head 11 and that differs from the heater to which the board terminals T3 and T4 are connected. The board terminals T13 and T14 are connected to the head terminals 27 of the read head that is an example of the loads provided on the magnetic head 11 and that differs from the read head to which the board terminals T5 and T6 are connected. The board terminals T15 and T16 are connected to the head terminals 27 of the write head that is an example of the loads provided on the magnetic head 11 and that differs from the read head to which the board terminals T7 and T8 are connected.

The preamplifier 17 has an amplifier terminal HDI-Y1 connected to the board terminal T1, an amplifier terminal HDI-X1 connected to the board terminal T2, an amplifier terminal Heater-Y1 connected to the board terminal T3, an amplifier terminal Heater-X1 connected to the board terminal T4, an amplifier terminal Read-Y1 connected to the board terminal T5, an amplifier terminal Read-X1 connected to the board terminal T6, an amplifier terminal Write-X1 connected to the board terminal T7, and an amplifier terminal Write-Y1 connected to the board terminal T8. In addition, the preamplifier 17 has an amplifier terminal HDI-Y2 connected to the board terminal T9, an amplifier terminal HDI-X2 connected to the board terminal T10, an amplifier terminal Heater-Y2 connected to the board terminal T11, an amplifier terminal Heater-X2 connected to the board terminal T12, an amplifier terminal Read-Y2 connected to the board terminal T13, an amplifier terminal Read-X2 connected to the board terminal T14, an amplifier terminal Write-X2 connected to the board terminal T15, and an amplifier terminal Write-Y2 connected to the board terminal T16. Furthermore, the preamplifier 17 applies a voltage to the board terminal group 26 via the amplifier terminals Read-X1, Read-Y1, Write-X1, Write-Y1, Heater-X1, Heater-Y1, HDI-X1, and HDI-Y1, and the amplifier terminals Read-X2, Read-Y2, Write-X2, Write-Y2, Heater-X2, Heater-Y2, HDI-X2, and HDI-Y2. The preamplifier 17 thereby writes the data to the disk 10 or reads the data from the disk 10.

As shown in FIG. 5, as the number of the board terminals T disposed on the FPC 16 increases, a distance between the board terminals T disposed on the FPC 16 has to be reduced accordingly. This possibly causes occurrence of a connection failure between the board terminals T. Disposing, in the FPC 16, an abnormality detection circuit that detects an abnormality such as a connection failure between the board terminals (for example, the board terminals T5 and T6) connected to the head terminal 27 of the common load provided on the magnetic head 11 has been developed recently. However, an abnormality such as a connection failure between the board terminals (for example, board terminals T6 and T7) connected to the head terminals 27 of the different loads provided on the magnetic head 11 are not detected.

To address this problem, in the present embodiment, an inter-terminal abnormality detection circuit that detects an abnormality such as a connection failure between the board terminals T connected to the head terminals 27 of the different loads provided on the magnetic head 11 is disposed in the FPC 16. It is thereby possible to detect not only the abnormality between the board terminals T connected to the head terminals 27 of the common load provided on the magnetic head 11 but also the abnormality between the board terminals T connected to the head terminals 27 of the different loads provided on the magnetic head 11. Therefore, it is possible to prevent failures that occur in the disk apparatus 1.

Figure 6:
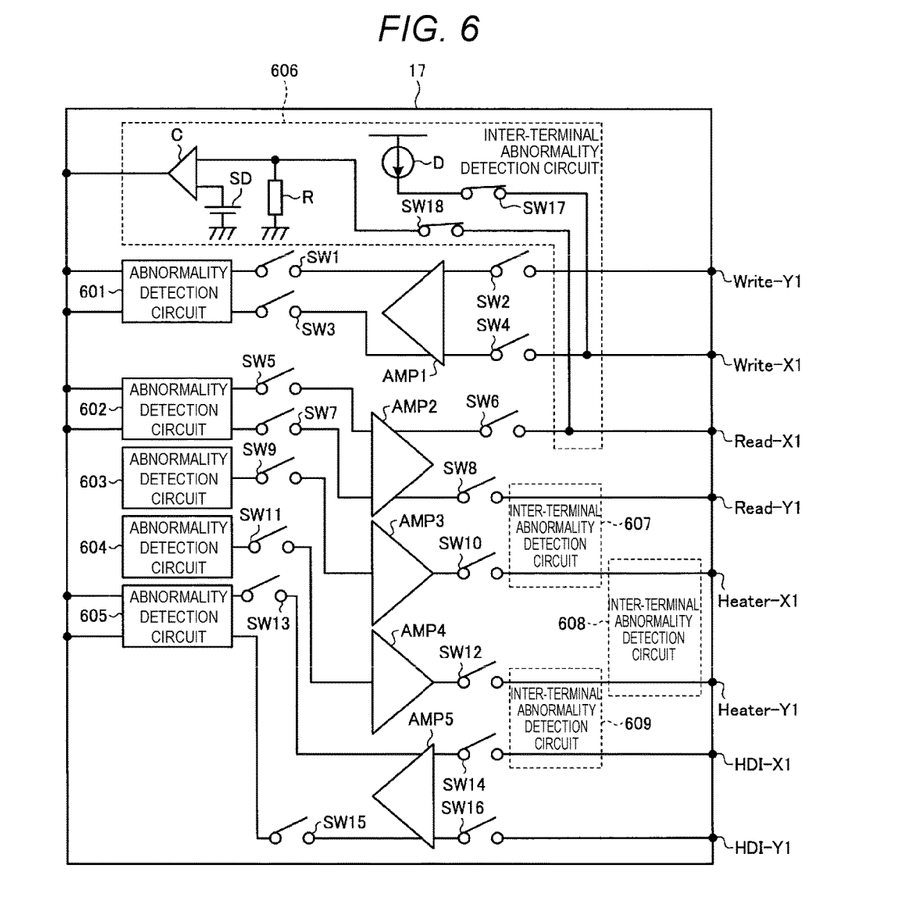
FIG. 6 shows an example of a configuration of a preamplifier of the FPC provided in the disk apparatus according to the present embodiment.

FIG. 6 shows an example of a configuration of the preamplifier of the FPC provided in the disk apparatus according to the present embodiment. A specific configuration of the preamplifier 17 of the FPC 16 provided in the disk apparatus 1 according to the present embodiment will next be described with reference to FIG. 6. The configuration of the preamplifier 17 that detects a short-circuit between the board terminals T connected to the amplifier terminals Read-X1, Read-Y1, Write-X1, Write-Y1, Heater-X1, Heater-Y1, HDI-X1, and HDI-Y1 will now be described. It is noted that the preamplifier 17 detects a short-circuit between the board terminals T connected to the amplifier terminals Read-X2, Read-Y2, Write-X2, Write-Y2, Heater-X2, Heater-Y2, HDI-X2, and HDI-Y2 with the same configuration. In the present embodiment, the preamplifier 17 has abnormality detection circuits 601 to 605, switches SW1 to SW16, amplifier circuits AMP1 to AMP5, and inter-terminal abnormality detection circuits 606 to 609. The abnormality detection circuit 601 detects a short-circuit between the board terminal T8 connected to the amplifier terminal Write-Y1 and the board terminal T7 connected to the amplifier terminal Write-X1. The abnormality detection circuit 602 detects a short-circuit between the board terminal T6 connected to the amplifier terminal Read-X1 and the board terminal T5 connected to the amplifier terminal Read-Y1. The abnormality detection circuit 603 detects a ground fault of the board terminal T4 connected to the amplifier terminal Heater-X1. The abnormality detection circuit 604 detects a ground fault of the board terminal T3 connected to the amplifier terminal Heater-Y1. The abnormality detection circuit 605 detects a short-circuit between the board terminal T2 connected to the amplifier terminal HDI-X1 and the board terminal T1 connected to the amplifier terminal HDI-Y1.

The switches SW1 and SW2 are switches that can disconnect the amplifier terminal Write-Y1 from the abnormality detection circuit 601. The switches SW3 and SW4 are switches that can disconnect the amplifier terminal Write-X1 from the abnormality detection circuit 601. The switches SW5 and SW6 are switches that can disconnect the amplifier terminal Read-X1 from the abnormality detection circuit 602. The switches SW7 and SW8 are switches that can disconnect the amplifier terminal Read-Y1 from the abnormality detection circuit 602.

The switches SW9 and SW10 are switches that can disconnect the amplifier terminal Heater-X1 from the abnormality detection circuit 603. The switches SW11 and SW12 are switches that can disconnect the amplifier terminal Heater-Y1 from the abnormality detection circuit 604. The switches SW13 and SW14 are switches that can disconnect the amplifier terminal HDI-X1 from the abnormality detection circuit 605. The switches SW15 and SW16 are switches that can disconnect the amplifier terminal HDI-Y1 from the abnormality detection circuit 605.

The inter-terminal abnormality detection circuit 606 detects a short-circuit between the board terminals T6 and T7 adjacent to each other. The inter-terminal abnormality detection circuit 607 detects a short-circuit between the board terminals T5 and T4 adjacent to each other. The inter-terminal abnormality detection circuit 608 detects a short-circuit between the board terminals T4 and T3 adjacent to each other. The inter-terminal abnormality detection circuit 609 detects a short-circuit between the board terminals T3 and T2 adjacent to each other. It is thereby possible to detect the abnormality between the board terminals T connected to the head terminals 27 of the different loads provided on the magnetic head 11. Therefore, it is possible to prevent failures that occur in the disk apparatus 1. In the present embodiment, the inter-terminal abnormality detection circuits 606 to 609 each detect the short-circuit between the adjacent board terminals T. However, a function of the inter-terminal abnormality detection circuits 606 to 609 is not limited this function as long as the inter-terminal abnormality detection circuits 606 to 609 each detect a short-circuit between the board terminals T connected to the different loads provided on the magnetic head 11. Furthermore, while the inter-terminal abnormality detection circuits 606 to 609 are disposed in the preamplifier 17 in the present embodiment, the inter-terminal abnormality detection circuits 606 to 609 may be disposed outside of the preamplifier 17 (for example, in the FPC 16).

An example of a specific configuration of the inter-terminal abnormality detection circuit 606 will now be described. Each of the other inter-terminal abnormality detection circuits 607 to 609 has a similar configuration to the configuration of the inter-terminal abnormality detection circuit 606 and will not be, therefore, described herein. The inter-terminal abnormality detection circuit 606 has a power supply D, switches SW17 and SW18, a current limiting resistor R, a reference power supply SD, and a comparator C. The switch SW17 is a switch that can disconnect the board terminal T7 from the inter-terminal abnormality detection circuit 606. The switch SW18 is a switch that can disconnect the board terminal T6 from the inter-terminal abnormality detection circuit 606.

The power supply D applies a voltage between the board terminals T7 and T6. The current limiting resistor R prevents a short-circuit between the board terminals T7 and T6 from causing an inrush current to flow to the comparator C. The comparator C compares an inter-terminal voltage that is the voltage between the board terminals T7 and T6 when the switches SW17 and SW18 are turned on with a reference voltage applied from the reference power supply SD. In addition, the comparator C detects the short-circuit between the board terminals T7 and T6 when the inter-terminal voltage between the board terminals T7 and T6 exceeds the reference voltage.

In the present embodiment, the preamplifier 17 turns off the switches SW1 to SW16 and disconnects the abnormality detection circuits 601 to 605 from the board terminals T when the disk apparatus 1 is in a test mode in which data is not written to or read from the disk 10 or during shipping of the disk apparatus 1. Moreover, the inter-terminal abnormality detection circuit 606 turns on the switches SW17 and SW18 and connects the board terminals T6 and T7 to the inter-terminal abnormality detection circuit 606. In addition, the comparator C detects the short-circuit between the board terminals T7 and T6 when the inter-terminal voltage between the board terminals T7 and T6 exceeds the reference voltage.

In this way, according to the present embodiment, the inter-terminal abnormality detection circuits 606 to 609 each detecting the abnormality such as the connection failure between the board terminals T connected to the head terminals 27 of the different loads provided on the magnetic head 11 are disposed. As a result, it is advantageously possible to detect not only the abnormality between the board terminals T connected to the head terminals 27 of the common load provided on the magnetic head 11 but also the abnormality between the board terminals T connected to the head terminals 27 of the different loads. Therefore, it is advantageously possible to prevent failures that occur in the disk apparatus 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A disk apparatus comprising:
a disk;
a magnetic head including a plurality of loads, including at least a first load and a second load, and a plurality of head terminals corresponding to and connected to the plurality of loads, respectively;
a circuit board including a plurality of board terminals corresponding to and connected to the plurality of head terminals, respectively, and a preamplifier configured to apply a voltage to the loads via the plurality of board terminals, the plurality of board terminals including a first board terminal and a second board terminal that are connected to the first load via at least part of the head terminals, and a third board terminal that is connected to the second load via at least part of the head terminals and not connected to the first load;
a first abnormality detection circuit configured to detect a short-circuit between the first board terminal and the second board terminal; and
a second abnormality detection circuit configured to detect a short-circuit between the second board terminal and the third board terminal.

2. The disk apparatus according to claim 1, wherein the first board terminal and the second board terminal are adjacent to each other.

3. The disk apparatus according to claim 1, wherein
each of the loads is one of a write head configured to write the data to the disk, a read head configured to read the data from the disk, a first contact sensor configured to detect a contact between the write head and the disk, a second contact sensor configured to detect a contact between the read head and the disk, and a heater that is controlled to thermally expand the write head or the read head.

4. The disk apparatus according to claim 1, wherein the second abnormality detection circuit includes:
a power supply that applies a voltage between the second board terminal and the third board terminal; and
a comparator configured to compare an inter-terminal voltage between the second board terminal and the third board terminal with a reference voltage, and detect the short-circuit between the second board terminal and the third board terminal when the inter-terminal voltage exceeds the reference voltage.

5. The disk apparatus according to claim 1, further comprising:
a third abnormality detection circuit connected to one of the board terminals and configured to detect a ground fault thereof.

6. The disk apparatus according to claim 1, wherein the circuit board is a flexible circuit board.

7. A head apparatus comprising:
a magnetic head including a plurality of loads, including at least a first load and a second load, and a plurality of head terminals corresponding to and connected to the plurality of loads, respectively;
a circuit board including a plurality of board terminals corresponding to and connected to the plurality of head terminals, respectively, and a preamplifier configured to apply a voltage to the loads via the plurality of board terminals, the plurality of board terminals including a first board terminal and a second board terminal that are connected to the first load via at least part of the head terminals, and a third board terminal that is connected to the second load via at least part of the head terminals and not connected to the first load;
a first abnormality detection circuit configured to detect a short-circuit between the first board terminal and the second board terminal; and
a second abnormality detection circuit configured to detect a short-circuit between the second board terminal and the third board terminal.

8. The head apparatus according to claim 7, wherein the first board terminal and the second board terminal are adjacent to each other.

9. The head apparatus according to claim 7, wherein
each of the loads is one of a write head configured to write the data to a disk, a read head configured to read the data from the disk, a first contact sensor configured to detect a contact between the write head and the disk, a second contact sensor configured to detect a contact between the read head and the disk, and a heater that is controlled to thermally expand the write head or the read head.

10. The head apparatus according to claim 7, wherein the second abnormality detection circuit includes:
a power supply that applies a voltage between the second board terminal and the third board terminal; and
a comparator configured to compare an inter-terminal voltage between the second board terminal and the third board terminal with a reference voltage, and detect the short-circuit between the second board terminal and the third board terminal when the inter-terminal voltage exceeds the reference voltage.

11. The head apparatus according to claim 7, further comprising:
a third abnormality detection circuit connected to one of the board terminals and configured to detect a ground fault thereof.

12. The head apparatus according to claim 7, wherein the circuit board is a flexible circuit board.

13. A pre-amplifier circuit for a disk apparatus comprising:
a plurality of terminals including first, second, and third terminals in order with no other terminal between first and second terminals and no other terminal between the second and third terminals, the first and second terminals for connection to a first load on a magnetic head, and the third terminal for connection to a second load on the magnetic head and not to the first load;
a plurality of abnormality detection circuits; and
a plurality of inter-terminal abnormality detection circuits, wherein
one of the abnormality detection circuits is configured to detect a short-circuit between the first and second terminals, and
one of the inter-terminal abnormality detection circuits is configured to detect a short-circuit between the second and third terminals.

14. The circuit according to claim 13, wherein the terminals are connectable to terminals on a flexible circuit board, and the terminals on the flexible circuit board are connectable to terminals on the magnetic head.

15. The circuit according to claim 13, wherein one of the inter-terminal abnormality detection circuits includes:
a power supply that applies a voltage between the second and third terminals; and
a comparator configured to compare an inter-terminal voltage between the second and third terminals with a reference voltage, and detect the short-circuit between the second and third terminals when the inter-terminal voltage exceeds the reference voltage.

* * * * *